United States Patent [19]

Tustaniwskyj

[11] Patent Number: 4,807,019

[45] Date of Patent: Feb. 21, 1989

[54] CAVITY-UP-CAVITY-DOWN MULTICHIP INTEGRATED CIRCUIT PACKAGE

[75] Inventor: Jerry I. Tustaniwskyj, Mission Viejo, Calif.

[73] Assignee: Unisys Corporation, Blue Bell, Pa.

[21] Appl. No.: 203,511

[22] Filed: Jun. 6, 1988

Related U.S. Application Data

[63] Continuation of Ser. No. 41,984, Apr. 24, 1987.

[51] Int. Cl.⁴ .................... H01L 23/02; H01L 23/08; H01L 23/10; H01L 23/12
[52] U.S. Cl. ........................................ 357/74; 357/75; 357/80
[58] Field of Search ................... 357/74, 72, 80, 81; 174/52 FD

[56] References Cited

U.S. PATENT DOCUMENTS

| | | | |
|---|---|---|---|
| 4,445,274 | 5/1984 | Suzuki et al. | 357/80 |
| 4,614,194 | 9/1986 | Jones et al. | 357/80 |
| 4,616,655 | 10/1986 | Weinberg et al. | 357/80 |

FOREIGN PATENT DOCUMENTS 59-44852  3/1984  Japan ........................... 357/75

Primary Examiner—Andrew J. James
Assistant Examiner—Sheila V. Clark
Attorney, Agent, or Firm—Charles J. Fassbender; Kenneth L. Miller

[57] ABSTRACT

A multichip integrated circuit package comprises a thin planar body which has top and bottom major surfaces. Conductors, for carrying electrical signals, are integrated into the body and include input/output terminals on one portion of the bottom surface. Downward-facing cavities for holding respective high power integrated circuit chips extend from another portion of the bottom surface into the body, and upward-facing cavities for holding respective low power integrated circuits extend from the top surface into the body. Small thermal resistance for the high power chips is achieved, and footprint is simultaneously minimized by locating the upward-facing cavities over the terminals.

17 Claims, 3 Drawing Sheets eq. 1 ~ 21-3 & 21-6 = $\frac{1}{4}'' \times \frac{1}{4}''$, 11-1 = $\frac{1}{2}'' \times \frac{1}{2}''$ eq. 2 ~ WIDTH OF FIG.1 PACKAGE ≅ $\frac{1}{4}'' + \frac{1}{2}'' + \frac{1}{4}'' = 1''$
AREA OF FIG.1 PACKAGE ≅ 1 SQ. INCH eq. 3 ~ WIDTH OF 4 ROWS OF I/O PIN ≅ $\frac{3}{8}''$ eq. 4 ~ WIDTH OF CAVITY DOWN PACKAGE
= $\frac{3}{8}'' + \frac{1}{4}'' + \frac{1}{2}'' + \frac{1}{4}'' + \frac{3}{8}'' = 1\frac{3}{4}''$ eq. 5 ~ AREA OF CAVITY DOWN PACKAGE = 3.06 SQ. INCH eq. 6 ~ PERCENT AREA SAVED = $\frac{3.06 - 1}{1} > 200\%$

CAVITY-UP-CAVITY-DOWN MULTICHIP INTEGRATED CIRCUIT PACKAGE

This is a continuation of co-pending application Ser. No. 041,984 filed on Apr. 24, 1987.

BACKGROUND OF THE INVENTION

This invention relates to integrated circuit packages; and more particularly, it relates to multichip packages which have a small footprint and provide thermal paths for cooling both high-power and low-power integrated circuits.

Initially in the prior art, integrated circuit chips were packaged separately. Such single-chip packages encapsulated a chip to protect it from contamination, and to provide input-output terminals by which the chip could be soldered into a printed circuit board. Typically, the packages were made of plastic or ceramic.

Subsequently, multichip integrated packages were developed which encapsulated several chips. One attractive feature of multichip packages is that they provide low capacitance interconnections between the chips within the package, and thus the delay of inter chip signal propagation is reduced. Usually, the number of chips which are encapsulated in a multichip package is between two and twenty.

A problem, however, which is aggravated by multichip packages is how to keep the package from overheating. This is because all of the chips in a package dissipate power which cause the package to heat up. To resolve such a heat-dissipation problem, it is very desirable to not compromise the size of the package's footprint. A package's footprint is the area which it occupies on a printed circuit board, and it should be kept as small as possible so that more packages can be placed on the board.

In the prior art, a cavity-down multichip package was often used whenever some of the chips to be packaged had a high power dissipation. Such a package is comprised of a thin body having top and bottom major surfaces; chips are held in downward-facing cavities which extend from the bottom surface into the body; and input/output pins are disposed in rows on the periphery of the bottom surface around the cavities. This package will cool the high power dissipating chips because it provides a small thermal resistance path from the downward-facing cavity to the top surface.

However, it has been determined by the present inventor that the cavity-down package is very inadequate for handling the frequent situation where some but not all of the chips have a high power dissipation. Specifically, in such a case, the present inventor has found that the footprint of the package can be reduced by over 100% without compromising the cooling for the high power chips.

Accordingly, a primary object of the invention is to provide a novel small footprint multichip package for holding both high power and low power chips.

BRIEF SUMMARY OF THE INVENTION

In accordance with the present invention, a multichip integrated circuit package comprises a thin planar body which has top and bottom major surfaces. Conductors, for carrying electrical signals, are integrated into the body and include input/output terminals on one portion of the bottom surface. Downward-facing cavities for holding respective high power integrated circuit chips extend from another portion of the bottom surface into the body, and upward-facing cavities for holding respective low power integrated circuits extend from the top surface into the body. Small thermal resistance for the high power chips is achieved, and footprint is simultaneously minimized by locating the upward-facing cavities over the terminals.

BRIEF DESCRIPTION OF THE DRAWINGS

Various preferred embodiments of the invention are described in the Detailed Description in conjunction with the accompanied drawings wherein.

DETAILED DESCRIPTION OF THE INVENTION

Figure 1:
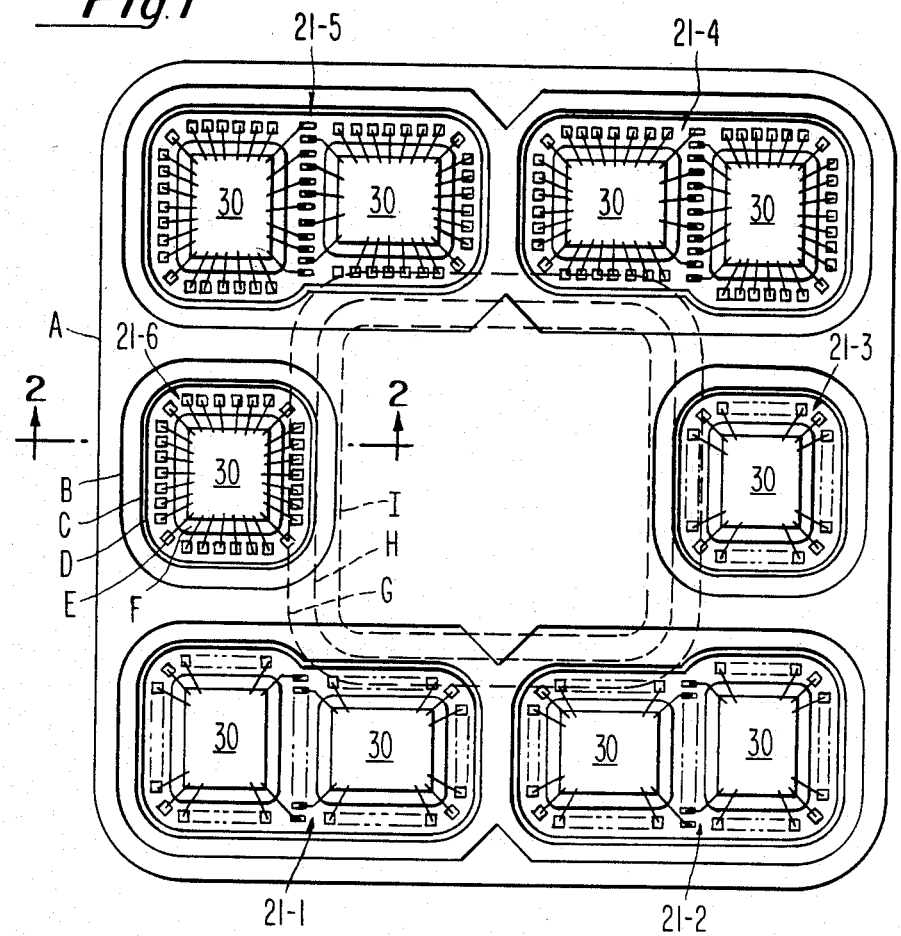
FIG. 1 is a top view of one embodiment of the invention.
Figure 2:
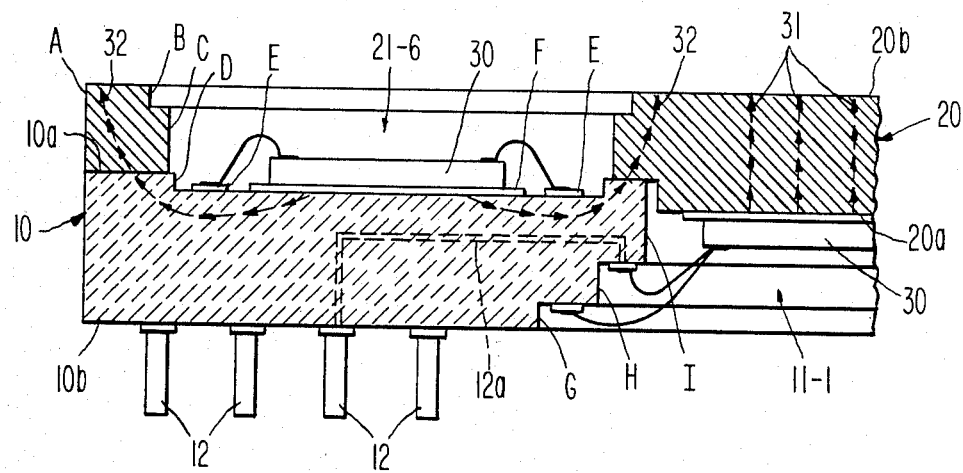
FIG. 2 is an enlarged sectional view taken along lines 2—2 in FIG. 1.

Referring now to FIGS. 1 and 2, a preferred embodiment of an integrated circuit package which is constructed according to the invention will be described in detail. This embodiment is comprised of two thin planar members 10 and 20 which are respectively made of alumina ceramic and copper tungsten. Member 10 has major surfaces 10a and 10b, and member 20 has major surfaces 20a and 20b. One aperture 11-1 passes through surfaces 10a and 10b of member 10 at its center; and six apertures 21-1 through 21-6 pass through surfaces 20a and 20b of member 20 around its periphery.

Surfaces 10a and 20a are permanently joined together by brazing or by an epoxy. Surface 10a blocks all of the apertures 21-1 through 21-6 in member 20, and surface 20a blocks aperture 11-1 in member 10. As a result, oppositely facing cavities are formed for holding integrated circuit chips 30. Letters A through I in FIGS. 1 and 2 identify corresponding points in these cavities. Letter F indicates a pad for attaching the chips in the cavity; letter E indicates a pad for bonding a signal-carrying wire to the chip, and all of the other letters simply indicate various edges. Thin flat lids (not shown) can be attached to the surfaces 10b and 20b to cover the cavities.

Input/output pins (I/O pins) 12 extend from surface 10b in a direction which is herein referred to as downward. That cavity which is formed by aperture 11-1 is also facing downward. By comparison, the cavities which are formed by apertures 21-1 through 21-6 are facing upward. All of the I/O pins 12 are arranged in four rows which go around the periphery of surface 10b. Conductors, only one of which is shown as 12a, are integrated into member 10 and connect the pins 12 to the wire bond pads.

These I/O pins 12 lie beneath the apertures 21-1 through 21-6 in member 20; and due to this arrangement, the footprint of the disclosed package is substantially reduced in comparison to the footprint of a conventional cavity-down package. High power integrated circuit chips are held in the downward-facing cavity since heat is conducted from them along a low thermal resistance path 31 to a heat sink (not shown) on surface 20b. Lower power integrated circuit chips are held in the downward-facing cavities, and heat is conducted from them along a higher thermal resistance path 32.

When member 10 is made of alumina ceramic and member 20 is made of copper tungsten, and surface 20b is air cooled, the thermal resistance of paths 31 and 32 respectively are about 4° C./watt and 25° C./watt. With those same materials and surface 20b being liquid cooled, the thermal resistance of paths 31 and 32 respectively are about 1/2° C./watt and 6° C./watt. Thus, in the latter case for example, chip 30 in the downward-facing cavity could dissipate 15 watts; each chip in the upward-facing cavity could dissipate 1-¼ watts; and the temperature of every chip would only be 7°-¼° C. above the temperature of the coolant.

Preferably, in the above cases, chips for the upward-facing cavities dissipate less than 2 watts. Such chips include bipolar static RAM chips, small scale integration logic chips, and CMOS dynamic RAMs. Also, preferably, chips for the downward-facing cavities dissipate more than 2 watts. Such chips include custom large scale bipolar chips, semicustom ECL gate arrays, and microcomputer chips.

Figures 3, 5:
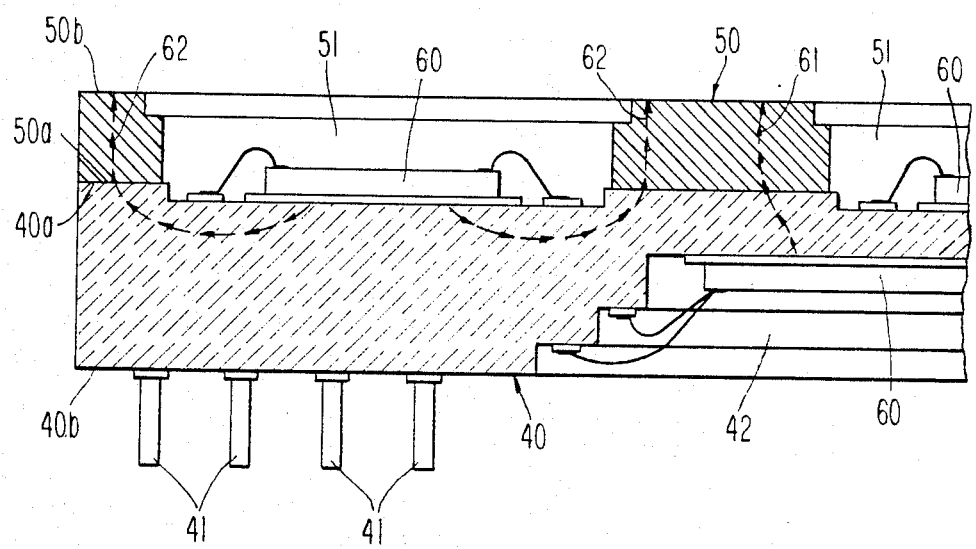
FIG. 3 is a set of equations which indicate how the embodiment of FIGS. 1 and 2 has a reduced footprint.
FIG. 5 is an enlarged sectional view of another embodiment of the invention.

A numerical example which illustrates the degree to which the footprint is reduced by the above described integrated circuit package is given in FIG. 3. There, equation 1 states a condition wherein cavities 21-3 and 21-6 are each one-quarter-inch on a side, and the cavity 11-1 is one-half-inch on a side. Under this condition, the width of the disclosed package would be about $\frac{1}{4}''+\frac{1}{2}''+\frac{1}{4}''$ or one inch; and consequently its footprint would be about one square inch. This is stated by equation 2.

A reasonable width of four rows of I/O pins 12 is about three-eighths of an inch. Thus, the width of a conventional cavity-down package which has cavities as given by equation 1 would be $\frac{3}{8}''+\frac{1}{4}''+\frac{1}{2}''+\frac{1}{4}''+\frac{3}{8}''$ or one and three-quarters inches. This is stated by equations 3 and 4. Such a cavity-down package would have a footprint of 3.06 square inches. Thus, the percent area saved by the disclosed integrated circuit package is more than 200%!

Figure 4:
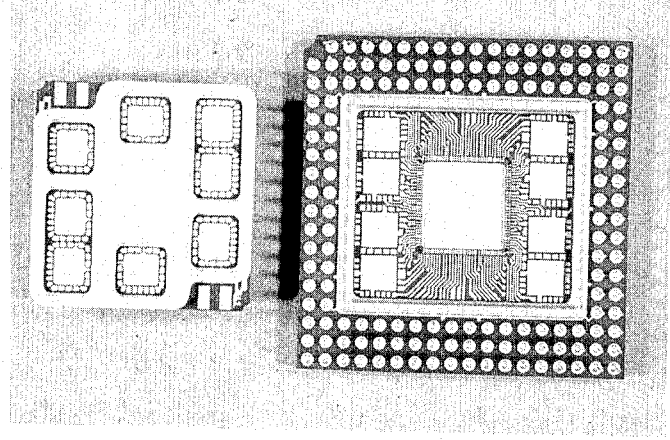
FIG. 4 is a photograph which compares an actual package that is constructed according to FIGS. 1 and 2 to a prior art cavity down package.

A photograph which compares an actual package that is constructed according to FIGS. 1 and 2 to the prior art cavity-down package is shown in FIG. 4. Both of these packages hold eight small low power chips, and one large high power chip. In the disclosed package, which is on the left, the eight small low power chips are positioned around the periphery of the top surface; the input/output pins are positioned below those eight chips on the bottom surface; and the one large high power chip is centrally located on the bottom surface. By comparison, in the prior art cavity-down package which is shown on the right, all of the high power and low power chips as well as the I/O pins are located on the bottom surface. Consequently, the footprint of the package on the right is more than 100% larger than the footprint of the package on the left.

Turning now to FIG. 5, another embodiment of the invention will be described. This embodiment is comprised of a planar member 40 which has major surfaces 40a and 40b, and another planar member 50 which has major surfaces 50a and 50b. Input/output pins 41 extend in a downward direction from the periphery of surface 40b, and one or more downward-facing cavities 42 also extend from that surface partway through member 40. In other words, member 40 differs from the previously described member 10 of FIGS. 1 and 2 in that no apertures completely penetrate member 40.

By comparison, member 50 does contain apertures 51 which penetrate its major surfaces. Also, surface 50a is permanently joined to surface 40a, and surface 40a blocks the apertures 51. Thus upward-facing cavities are formed for holding respective integrated chips 60. Some of these upward-facing cavities in member 50 partially overlie the downward-facing cavities 42 in member 40. Consequently, the number of chips which the FIG. 4 embodiment holds for a given footprint size is increased over the previously described embodiment.

Heat is conducted from the chips 60 in the downward-facing cavities 42 along a thermal path 61, and heat is conducted from the chips 60 in the upward-facing cavities along a thermal path 62. By always providing a solid portion of member 50 directly over each downward-facing cavity 42, path 61 will have a lower thermal resistance than path 62. For example, when member 40 is made of ceramic and member 50 is made of copper tungsten and surface 52b is liquid cooled, the thermal resistances 61 and 62 respectively are about 2° C./watt and 6° C./watt.

Various preferred embodiments of the invention have now been described in detail. In addition, however, many changes and modifications can be made to these details without departing from the nature and spirit of the invention. For example, the top member 20 in the FIG. 2 embodiment as well as the top member 40 in the FIG. 4 embodiment can be constructed of metals other than copper tungsten such as copper-molybdenum-copper, and they can also be constructed of ceramic. Further, if members 10 and 20, or members 40 and 50, are both made of ceramic, then they can be co-fired together as a single integrated body. Also, the input/output pins have the FIG. 2 and FIG. 4 embodiments can be replaced with other terminals such as those which are suitable for surface mounting.

Accordingly, it is to be understood that the invention is not limited to the above details but is defined by the appended claims.

What is claimed is:

1. A cavity-up-cavity-down integrated circuit package, comprising:
    top and bottom thin planar members; each of said thin planar members having an upward-facing major surface and a downward-facing major surface, and having at least one aperture which penetrates both of its major surfaces;
    said downward-facing major surface of said top planar member being permanently joined via a single material and a single interface to said upward-facing major surface of said bottom planar member;
    each aperture in said top planar member being located such that it is blocked by said upward-facing major surface of said bottom planar member, and each aperture in said bottom planar member being located such that it is blocked by said downward-facing surface of said top planar member;
    a low power integrated circuit chip on said upward-facing surface fo said bottom member within each aperture of said top member, and a high power integrated circuit chip on said downward-facing surface of said top member within each aperture of said bottom member; and
    conductors, integrated into said bottom member but not said top member, for carrying electrical signals from said downward-facing surface of said bottom member to all of said chips; whereby each high power chip has a thermal conduction path which goes directly through said thin top planar member; each low power chip has a thermal conduction path which goes from said bottom planar member through said single interface to said top planar member; and every chip has short signal paths that go through just said bottom member.

2. An integrated circuit package according to claim 1 wherein said downward-facing surface of said top planar member is directly joined to said upward-facing surface of said bottom planar member by either an epoxy or a braze.

3. An integrated circuit package according to claim 2 wherein said top planar member and said bottom planar member have respective perimeters that coincide with one another.

4. An integrated circuit package according to claim 3 wherein said bottom planar member has just one aperture, and wherein input/output terminals are located on said downward-facing surface of said bottom member as an array around said one aperture.

5. An integrated circuit package according to claim 4 wherein said top planar member has multiple apertures which overlie and are aligned with said input/output terminals.

6. An integrated circuit package according to claim 5 wherein said high power integrated circuit chip dissipates at least two watts, and each low power integrated circuit chip dissipates less than two watts.

7. An integrated circuit package according to claim 6 wherein said top planar member is made of a material having a substantially higher thermal conductivity than said bottom planar member.

8. An integrated circuit package according to claim 1 wherein said top planar member and said bottom planar member have respective perimeters that coincide with one another.

9. An integrated circuit package according to claim 1 wherein said bottom planar member has just one aperture, and wherein input/output terminals are located on said bottom planar member in an array around said one aperture.

10. An integrated circuit package according to claim 1 wherein said top planar member has multiple apertures, and wherein input/output terminals are located on said top planar member in alignment with said multiple apertures.

11. An integrated circuit package according to claim 1 wherein each high power integrated circuit chip dissipates at least two watt, and each low power integrated circuit chip dissipates less than two watts.

12. An integrated circuit package according to claim 1 wherein said top planar member is made of a material having a substantially higher thermal conductivity than said bottom planar member.

13. A cavity-up-cavity-down integrated circuit package, comprising:

a thin planar body, which is integrated as one indivisible unit, having a top major surface and a bottom major surface;

a downward-facing cavity which extends from said bottom surface to just partway through said body;

an upward-facing cavity which extends from said top surface to just partway through said body;

a low power integrated circuit chip in said upward-facing cavity, and a high power integrated circuit chip in said downward-facing cavity; and conductors, integrated into said body, for carrying electrical signals to all of said chips; whereby said high power chip in said downward-facing cavity has a thermal conduction path which goes directly through said body to said top surface, and said low power chip on said upward-facing cavity has a thermal conduction path which goes through said body around said upward-facing cavity to said top surface.

14. An integrated circuit package according to claim 13 wherein said body consists of cofired layers of ceramic.

15. An integrated circuit package according to claim 13 wherein said bottom surface has just one cavity, and wherein input/output terminals are located on said bottom surface as an array around said one cavity.

16. An integrated circuit package according to claim 15 wherein said top surface has multiple cavities which overlie and are aligned with said input/output terminals.

17. An integrated circuit package according to claim 16 wherein said high power integrated circuit chip dissipates at least two watts, and said low power integrated circuit chip dissipates less than two watts.

* * * * *